US012777966B2

(12) United States Patent
Gu et al.

(10) Patent No.: US 12,777,966 B2
(45) Date of Patent: Oct. 27, 2026

(54) MULTI-SIDE POWER DELIVERY IN STACKED MEMORY PACKAGING

(71) Applicant: Huawei Technologies Co., Ltd., Shenzhen (CN)

(72) Inventors: Shiqun Gu, San Diego, CA (US); Rui Niu, Beijing (CN); Xiaodong Zhang, Shanghai (CN); Yiwei Ren, Shanghai (CN); Tonglong Zhang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 1273 days.

(21) Appl. No.: 17/687,220

(22) Filed: Mar. 4, 2022

(65) Prior Publication Data

US 2022/0189901 A1 Jun. 16, 2022

Related U.S. Application Data

(63) Continuation of application No. PCT/US2019/049708, filed on Sep. 5, 2019.

(51) Int. Cl.
*H10W 70/09* (2026.01)
*H10W 70/60* (2026.01)
(Continued)

(52) U.S. Cl.
CPC .......... *H10W 90/00* (2026.01); *H10W 70/09* (2026.01); *H10W 70/614* (2026.01); (Continued)

(58) Field of Classification Search
CPC ... H10W 90/00; H10W 70/614; H10W 70/09; H10W 72/823
See application file for complete search history.

(56) References Cited

U.S. PATENT DOCUMENTS

2005/0157477 A1 7/2005 Kuramochi et al.
2012/0056316 A1* 3/2012 Pagaila ............ H01L 23/49811 257/737

(Continued)

FOREIGN PATENT DOCUMENTS

DE 102016100523 5/2017

OTHER PUBLICATIONS

International Preliminary Report on Patentability dated Mar. 17, 2022, International Application No. PCT/US2019/049708.

(Continued)

*Primary Examiner* — Trang Q Tran

(57) ABSTRACT

A packaged IC includes a fanout layer, a processor having a first surface residing substantially adjacent a first surface of the fanout layer, a Redistribution Layer (RDL) having a first surface coupled to a second surface of the processor, and a memory coupled to a second surface of the RDL, wherein a first portion of the memory is disposed outside of a footprint of the processor and a second portion of the memory is disposed within the footprint of the processor. The packaged IC further includes first conductive posts disposed beneath the first portion of the memory proximate a first side of the processor for providing communication links between the processor and memory, and second conductive posts coupled between the fanout layer and conductive features of the RDL coupled to power inputs of the second portion of the memory, the second conductive posts proximate a second side of the processor.

13 Claims, 8 Drawing Sheets

(51) Int. Cl.
*H10W 90/00* (2026.01)
*H10W 72/00* (2026.01)
*H10W 90/20* (2026.01)
*H10W 90/22* (2026.01)

(52) U.S. Cl.
CPC .......... *H10W 70/60* (2026.01); *H10W 72/823* (2026.01); *H10W 90/20* (2026.01); *H10W 90/22* (2026.01); *H10W 90/722* (2026.01)

(56) References Cited

U.S. PATENT DOCUMENTS

| | | | |
|---|---|---|---|
| 2016/0247784 A1 | 8/2016 | Wang | |
| 2017/0133351 A1* | 5/2017 | Su | H01L 25/105 |
| 2018/0053746 A1 | 2/2018 | Yu et al. | |
| 2018/0122780 A1* | 5/2018 | Chen | H10W 74/019 |
| 2018/0174865 A1 | 6/2018 | Yu et al. | |

OTHER PUBLICATIONS

International Search Report and Written Opinion dated Apr. 8, 2020, International Application No. PCT/US2019/049708.

* cited by examiner

MULTI-SIDE POWER DELIVERY IN STACKED MEMORY PACKAGING

CLAIM OF PRIORITY

This application is a continuation of PCT Patent Application No. PCT/US2019/049708 entitled "MULTI-SIDE POWER DELIVERY IN STACKED MEMORY PACKAGING", filed Sep. 5, 2019, which is incorporated herein by reference in its entirety.

TECHNICAL FIELD

The present application relates to Integrated Circuit (IC) technology; and more particularly to the packaging of processors with memory.

BACKGROUND

Integrated Circuit (IC) technology has advanced greatly over the past fifty years. ICs are now pervasive and present in electronic devices, machinery, vehicles, appliances, and many other devices. The density of transistors in modern ICs can reach 100 million transistors per square millimeter, and some large processing ICs now include billions of transistors while memory ICs may include hundreds of billions of transistors. However, the processing capability of a single IC may not be sufficient to meet the requisite processing needs of certain systems. Thus, multiple IC dies or devices are sometimes closely coupled and packaged together to provide greater processing capabilities.

Such multiple IC packages are used in a great number of differing applications including, without limitation, mobile communication devices, artificial intelligence devices, and graphics processing units. Typically, an Application Processor (AP) used in such devices includes a specialized processing structure to service the particular application, e.g., communications processor, graphics processor, etc. The AP typically has significant memory requirements, including large memory bandwidth as well as rapid memory access. Thus, multiple IC packages now often include both an AP and high bandwidth memory.

Current POP (Package on Package) packages use memory that provides up to 51.2 GBps peak bandwidth for LPDDR (Low Power Double Data Rate, e.g., $5^{th}$ Generation) installations. To increase IO speed beyond 51.2 GBps would be very difficult for LPDDR due to limited pin availability. Further, increasing memory access speeds increases power consumption and internal heat production, and may compromise signal integrity. Certain prior art alternatives involve stacking WIO (Wide Input/Output) memory on a back-side of a processor, which requires through silicon vias (TSVs). Another prior art solution involves use of an interposer or lateral FO (Fan Out) connection, which increases package size. Still other prior art alternatives require vias that extended through the AP. Other prior alternatives have additional potential shortcomings, such as strict alignment requirements and poor signal pathways.

SUMMARY

The present disclosure provides various aspects that may be employed with one or more of the embodiments. These aspects may be combined with one another singularly, in various combinations, or in total. According to a first embodiment of the present disclosure, a packaged Integrated Circuit (IC) is provided, the packaged IC including a fanout layer having conductive lines and conductive vias. The packaged IC further includes a processor having a first surface residing substantially adjacent a first surface of the fanout layer, a Redistribution Layer (RDL) having a first surface coupled to a second surface of the processor, and a memory coupled to a second surface of the RDL, wherein a first portion of the memory is disposed outside of a footprint of the processor and a second portion of the memory is disposed within the footprint of the processor.

In this embodiment, an encapsulant surrounds a portion of the memory, the RDL, and the processor, the encapsulant contacting the fanout layer on a first side and having an exposed second side. The packaged IC additionally includes a first plurality of conductive posts coupled between the fanout layer and the RDL through a portion of the encapsulant disposed beneath the first portion of the memory adjacent a first side of the processor, the first plurality of conductive posts providing data communication links between the processor and the memory via the fanout layer and the RDL. A second plurality of conductive posts are coupled between the fanout layer and conductive features of the RDL through a portion of the encapsulant that is proximate a second side of the processor, the conductive features of the RDL coupled to power inputs of the second portion of the memory. This embodiment further includes a plurality of Through Mold Vias (TMVs) extending between the fanout layer and the exposed second side of the encapsulant.

According to a first aspect of the first embodiment, the packaged IC further comprises a third plurality of conductive posts coupled between the fanout layer and the RDL through a portion of the encapsulant that is proximate the first side of the processor. The third plurality of conductive posts is coupled, via the RDL, to power inputs of the first portion of the memory. According to a second aspect of the packaged IC of the first embodiment, the second plurality of conductive posts are further coupled between the fanout layer and conductive features of the RDL through a portion of the encapsulant that is proximate at least a third side of the processor.

According to a third aspect of the first embodiment, the processor is one or more of a graphics processing unit, a communications processor, or an application specific processor. According to a fourth aspect of the packaged IC of the first embodiment, the packaged IC further comprises a dummy silicon substrate disposed adjacent the memory. According to a fifth aspect of the first embodiment, the packaged IC further includes a ball grid array coupled to the plurality of TMVs, and a Package on Package (POP) memory coupled to the ball grid array. According to a sixth aspect of the first embodiment, the memory is a high bandwidth memory relative to the POP memory. According to a seventh aspect of the first embodiment, the packaged IC further comprises a PCB ball grid array coupled to a second surface of the fanout layer.

In a second embodiment of the present disclosure, a method is provided for constructing a packaged Integrated Circuit (IC). According to the method, first level conductive posts are formed on a carrier substrate. The method of this embodiment further includes attaching a first side of a memory to the carrier substrate, the memory having a second side with conductive contacts for power inputs and data connections of the memory, and encapsulating the first level conductive posts and the memory with first encapsulant that contacts the carrier substrate on a first side and has an exposed second side.

In accordance with the method, a Redistribution Layer (RDL) is placed on the exposed second side of the first encapsulant, such that a first side of the RDL is disposed adjacent to and extends beyond the second side of the memory. The method further includes forming second level conductive posts on a second side of the RDL, and placing a processor on the second side of the RDL such that a first portion of the memory is disposed outside of a footprint of the processor and a second portion of the memory is disposed within the footprint of the processor. According to the method, the second level conductive posts and the processor are encapsulated with second encapsulant that contacts the second side of the RDL and has an exposed second side.

In this second embodiment, the method further includes forming a fanout layer on the exposed second side of the second encapsulant such that a first plurality of the second level conductive posts provide data communication links, via the RDL, between the processor and the conductive contacts for the data connections of the memory, a second plurality of the second level conductive posts are coupled, via the RDL, to the conductive contacts for the power inputs of the memory, and the first level conductive posts and a third plurality of the second level conductive posts form Through Mold Vias (TMVs) extending between the carrier substrate and the fanout layer.

The second embodiment also includes a plurality of aspects that may apply singularly or in combination. According to a first aspect of the method of the second embodiment, the data connections of the memory are disposed on the first portion of the memory and the power inputs are disposed on the second portion of the memory. According to a second aspect of the second embodiment, the second plurality of the second level conductive posts are disposed outside a footprint of the memory.

According to a third aspect of the second embodiment, the method further includes removing the carrier substrate to expose the first level conductive posts, forming a ball grid array on the exposed first level conductive posts, and placing Package on Package (POP) memory on the ball grid array. According to a fourth aspect of the second embodiment, the method further comprises forming a PCB ball grid array on an exposed surface of the fanout layer. According to a fifth aspect of the GPU of the second embodiment, the method further includes placing a dummy silicon substrate beside the memory, wherein the first encapsulant surrounds at least a portion of the dummy silicon substrate.

According to a third embodiment of the present disclosure, a packaged Integrated Circuit (IC) is provided, the packaged IC including a fanout layer having conductive lines and conductive vias. The packaged IC further includes a processor having a first surface residing substantially adjacent a first surface of the fanout layer, a plurality of conductive posts extending from the fanout layer, and a first encapsulant surrounding at least a portion of the processor and the plurality of conductive posts, the first encapsulant contacting the fanout layer on a first side and having an exposed second side. In this third embodiment, the packaged IC also includes a Redistribution Layer (RDL) having a first surface coupled to a second surface of the processor and the exposed second side of the first encapsulant, and a memory coupled to a second surface of the RDL, wherein a first portion of the memory is disposed outside of a footprint of the processor and a second portion of the memory is disposed within the footprint of the processor.

According to this third embodiment, a first plurality of conductive posts are coupled between the fanout layer and the RDL through a portion of the first encapsulant disposed beneath the first portion of the memory adjacent a first side of the processor, the first plurality of conductive posts providing data communication links between the processor and the memory. Additionally, a second plurality of conductive posts are coupled between the fanout layer and conductive features of the RDL through a portion of the first encapsulant that is proximate a second side of the processor, the conductive features of the RDL coupled to power inputs of the second portion of the memory. In this third embodiment, the packaged IC further includes a first plurality of Through Mold Vias (TMVs) extending from the fanout layer through the first encapsulant, a second encapsulant surrounding at least a portion of the memory and the RDL, and a second plurality of TMVs extending from the first plurality of TMVs through the second encapsulant.

The third embodiment also includes a plurality of aspects that may apply singularly or in combination. According to a first aspect of the third embodiment, the packaged IC further comprises a third plurality of conductive posts coupled between the fanout layer and the RDL through a portion of the first encapsulant that is proximate the first side of the processor, the third plurality of conductive posts coupled, via the RDL, to power inputs of the first portion of the memory. According to a second aspect of the third embodiment, the second plurality of conductive posts are further coupled between the fanout layer and conductive features of the RDL through a portion of the first encapsulant that is proximate at least a third side of the processor.

According to a third aspect of the third embodiment, the packaged IC further comprises a dummy silicon substrate disposed adjacent the memory. According to a fourth aspect of the third embodiment, the packaged IC further comprises a ball grid array coupled to the second plurality of TMVs, and a Package on Package (POP) memory coupled to the ball grid array. According to a fifth aspect of the third embodiment, the packaged IC further includes a PCB ball grid array coupled to a second surface of the fanout layer. The third embodiment can further include additional aspects such as those described above in conjunction with the first embodiment.

The disclosed embodiments introduce multi-side power delivery to a memory device in a packaged IC including a processor. Power delivery to the memory is provided, in part, by a fanout layer and conductive features of an RDL. As compared to prior architectures, the disclosed embodiments offer power delivery with reduced IR drop across the memory, and do not require use of relatively expensive through silicon vias (TSVs) or the larger package sizes associated with side-by-side placement of a processor and memory. These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
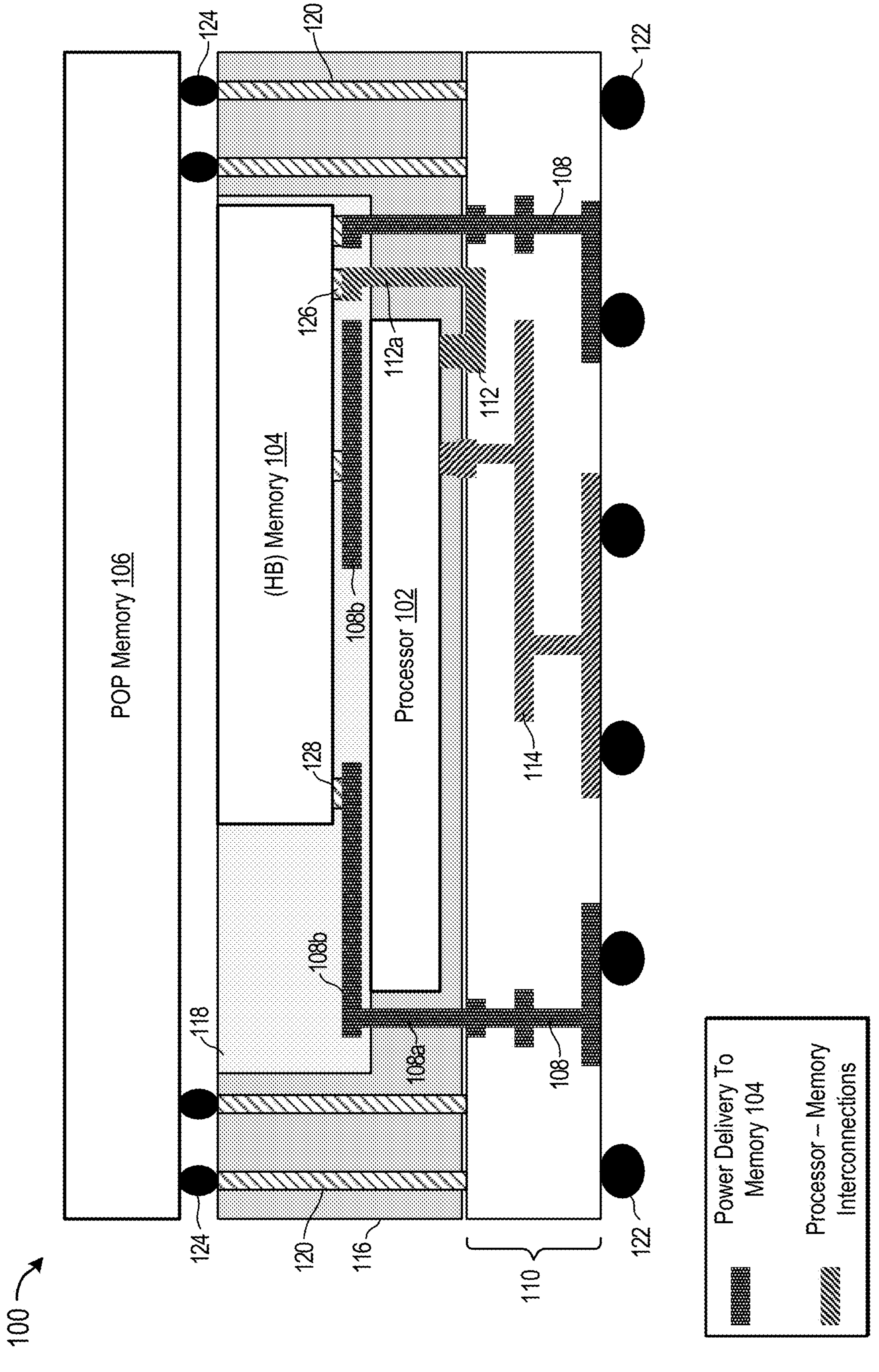
FIG. 1 is a sectional side view illustrating a packaged Integrated Circuit (IC) constructed in accordance with an embodiment of the present disclosure.

It should be understood at the outset that, although illustrative implementations of one or more embodiments are provided below, the disclosed devices and/or methods may be implemented using any number of techniques and materials, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents. Throughout the various views and illustrative embodiments described below, like reference numerals are used to designate like elements in some embodiments.

Novel methodologies and architectures are introduced below for improving power distribution and utilization in a packaged Integrated Circuit (IC) without utilizing through silicon vias (TSVs). As described in greater detail below, a packaged IC in accordance with the present disclosure a fanout layer and conductive features of an RDL to provide power deliver to multiple sides of a memory (e.g., a high bandwidth memory) that supports a processor. In an example, a first portion of the memory is disposed outside of a footprint of the processor. Data communications links are formed between the processor and the first portion of the memory, the links including conductive posts (e.g., Through Mold Vias (TMVs)) disposed beneath the first portion of the memory proximate to a first side of the processor. Multi-side power delivery to the memory is provided by the RDL and additional conductive post disposed proximate at least a second side of the processor. In this manner, power delivery to the memory is relatively symmetric, thereby minimizing undesirable IR drops across the memory.

Referring now to FIG. 1, a sectional side view illustrating a packaged Integrated Circuit (IC) 100 constructed in accordance with an embodiment of the present disclosure is shown. The described packaged IC 100 provides a memory 104 (e.g., a high bandwidth, high density memory device) for use by a processor 102. The packaged IC 100 further includes a fanout layer 110 having power conductors and vias 108 and signal conductors and vias 112/114. The fanout layer can be formed in a semiconductor manufacturing process. The processor 102 has a first surface residing substantially adjacent a first surface of the fanout layer 110. The processor 102 may be an Application Processor (AP), a graphics processing unit (GPU), a communications processor, a general-purpose processor, an application specific processor, or another type of processor or processing unit. The processor 102 can mount directly to the fanout layer 110 or, alternatively, mount upon an intermediary layer.

In this example, a Redistribution Layer (RDL) 108*b* has a first surface that is partially disposed over or coupled to a second surface of the processor 102. The RDL 108*b* can also be formed in a semiconductor manufacturing process and provides power conductors formed therein that couple to the power conductors and vias 108 of the fanout layer 110 through conductive posts 108*a*. As described more fully below, the RDL 108*b* further services data communication links between the processor 102 and the memory 104 through conductive posts 112*a*. All of these power and/or signal conductors may be formed of copper with dimensions greater than one micrometer, for example.

Figure 3:
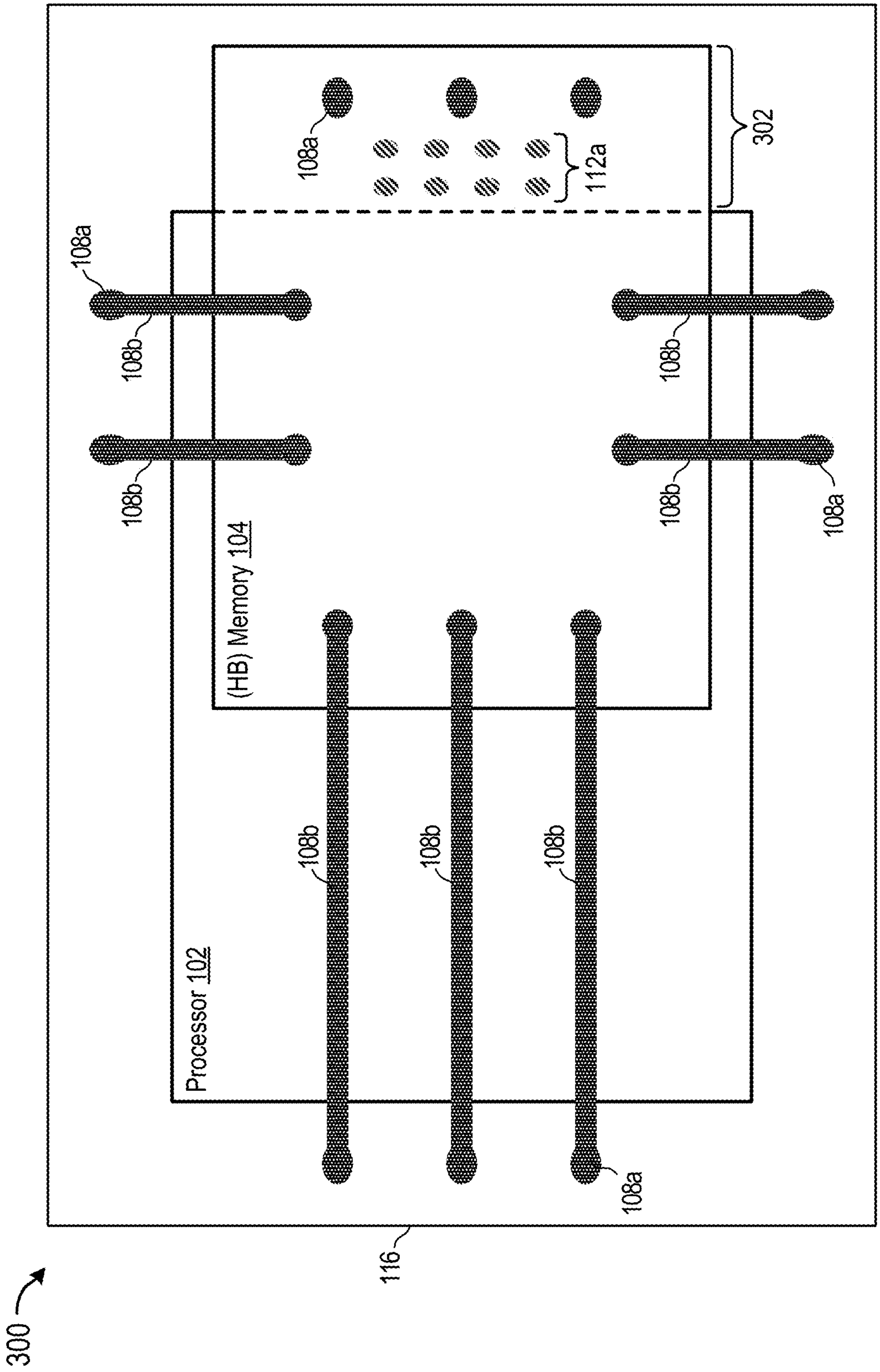
FIG. 3 is a diagrammatic top view of a portion of the packaged IC of the embodiment of FIG. 1 or FIG. 2.

In the illustrated packaged IC 100 of FIG. 1, the memory 104 couples to a second surface of the RDL 108*b*. As also shown in FIG. 3 (element 302), a first portion of the memory 104 is disposed outside a footprint of the processor 102 while a second portion of the memory 104 is disposed within (i.e., overlaps) the footprint of the processor 102. The memory 104 of the embodiment of FIG. 1 may be any type of memory that supports the high bandwidth storage requirements of the processor 102. For example, the memory 104 may be a LPDDR SDRAM, RAM, ROM, static RAM, optical memory, or another memory type.

In the embodiment of FIG. 1, power delivery to the memory 104 is provide by power conductors disposes on two or more sides of the processor 102. For example, power can be provided to one or more power inputs 128 of the first portion of the memory 104 (disposed outside of the footprint of the processor 102) through the RDL 108*b* and one or more conductive posts 108*a* disposed proximate a first side of the processor 102. Additionally, power can be provided to one or more power inputs 128 of the second portion of the memory through the RDL 108*b* and one or more additional conductive posts 108*a* disposed proximate a second side of the processor 102. In this example, the first portion of the memory 104 includes a plurality of data connections 126 (e.g., I/O pads) to support data communication links with the processor 102. Such data communication links are formed by coupling the data connections 126 to signal conductors and vias 112 (which in turn are coupled to the processor 102) through conductive posts 112*a*. As used herein, the terms "proximate" and "proximate to" refer to a very near, close or adjacent spatial relationship. A proximate spatial relationship between elements such as conductive posts and a processor may be desirable, for example, to minimize the size of a packaged IC.

Optionally, the memory 104 can be further configured to communicate wirelessly with the processor 102, e.g., via inductive coupling, capacitive coupling or Radio Frequency (RF) coupling. The memory 104 may include antennas, contacts, and/or coils to assist with the wireless communications. The processor 102 may also include antennas, contacts, and/or coils to support wireless communications with the memory 104. In an alternate construct, the antennas, contacts, and/or coils may be formed external to the memory 104 and/or the processor 102 and electrically couple thereto.

In the illustrated embodiment, an encapsulant 116 surrounds a substantial portion of the memory 104, the RDL 108*b*, and the processor 102. As used herein, the term "substantial portion" refers to most or all of the otherwise exposed outer surface of an encapsulated element. For example, an encapsulant can surround at least one of a top or bottom surface of a semiconductor element of a packaged IC, as well as all or most of the side surfaces of the semiconductor element. In the embodiment of FIG. 1, the encapsulant 116 contacts the fanout layer 110 on a first side and has an exposed second side. An optional backside RDL or molding (not separately illustrated) may be mounted or formed on an upper surface of the memory 104 or encapsulant 116. The plurality of conductive posts 108*a* and 112*a* extend from the fanout layer 110 to the RDL 108*b* through a portion of the encapsulant 116. A plurality of Through Mold Vias (TMVs) 120 extend between the fanout layer 110 and the exposed second side of the encapsulant 116. The TMVs 120 support communications and power delivery between the fanout layer 110 and a Package on Package (POP) memory 106 that provide additional storage resources to the processor 102. A ball grid array 124 couples to the plurality of TMVs 120 and provides connections between the fanout layer 110 and the POP memory 106. The packaged IC 100 of the illustrated embodiment also includes a Printed Circuit Board (PCB) ball grid array 122 coupled to the fanout layer 110 that supports mounting of the packaged IC 100 to a PCB. In an example, the encapsulant 116 can comprise an encapsulant portion 118 that is formed in a second-stage molding process. When a second-stage molding process is used, the encapsulant portion 118 may be formed of the same or differing molding/insulation material as the encapsulant 116.

Figure 2:
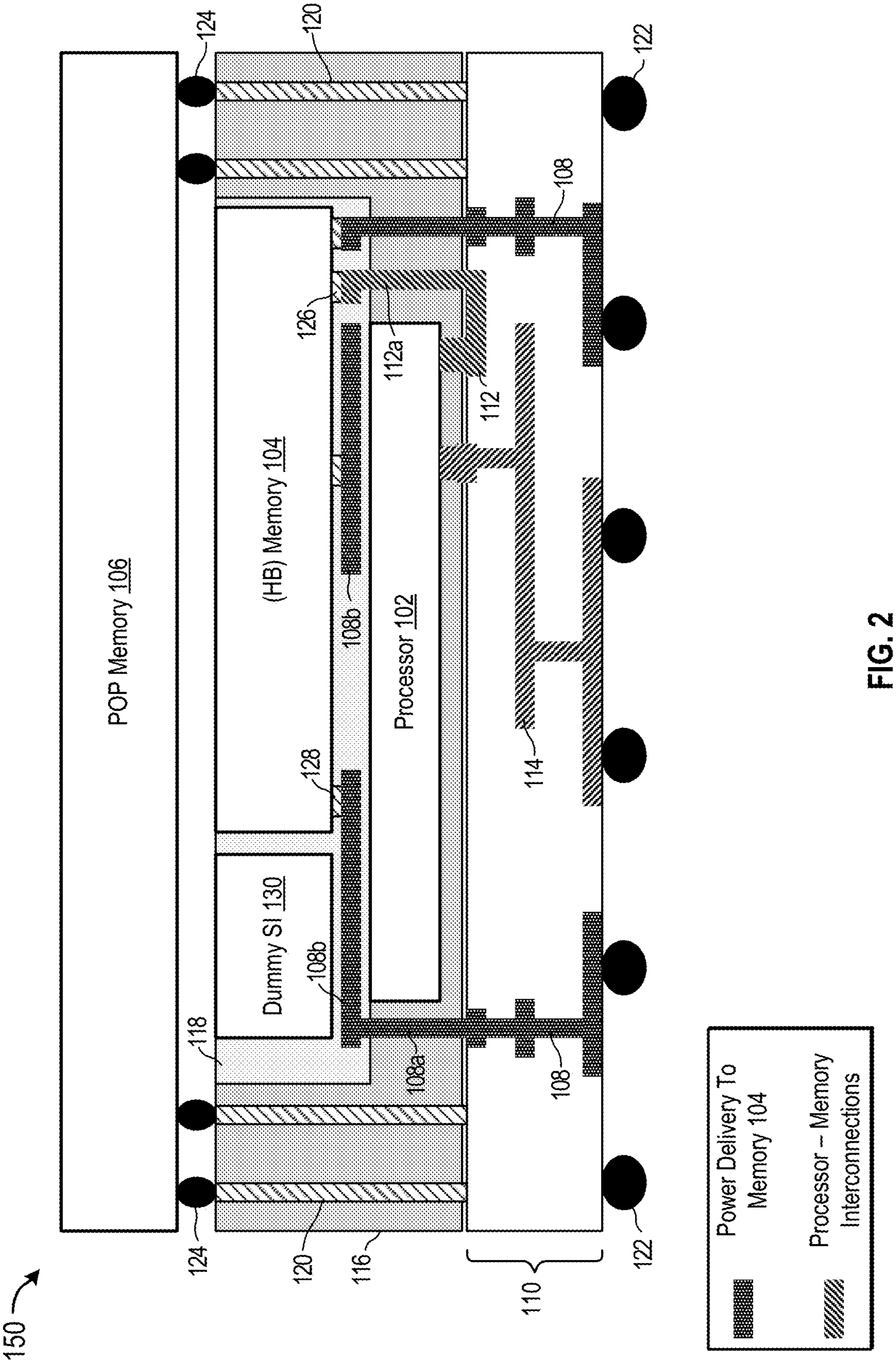
FIG. 2 is a sectional side view illustrating a packaged IC constructed in accordance with another embodiment of the present disclosure.

FIG. 2 is a sectional side view illustrating a packaged IC 150 constructed in accordance with another embodiment of the present disclosure. The packaged IC 150 of FIG. 2 is substantially similar to the packaged IC 100 of FIG. 1 with the addition of a dummy silicon substrate 130 residing beside the memory 104 within the encapsulant 116. The dummy silicon substrate 130 of the illustrated embodiment has thermal expansion properties similar to those of the memory 104 and the processor 102, and functions to reduce temperature-related stress on the packaged IC 150. The size of the dummy silicon substrate 130 can vary depending on the relative sizes and locations of the processor 102 and memory 104 in a given implementation.

FIG. 3 is a diagrammatic top view of a portion of a packaged IC 300, such as the packaged IC 100 of the embodiment of FIG. 1. In the illustrated embodiment, the packaged IC 300 includes the processor 102 and the memory 104. The ball grid array 122, the POP memory 106, the data connections 126, the power inputs 128, and the dummy silicon substrate 130 (if utilized) are omitted for sake of clarity.

As illustrated in FIG. 3, a portion 302 of the memory 104 resides outside a footprint of the processor 102 (i.e., the memory 104 overlaps the processor 102). In this example, the data connections of the memory are disposed on the first portion of the memory 104 and the power inputs are disposed on each of the first and second portions of the memory 104. As previously described, data communication links between the processor 102 and the memory 104 are provided through conductive posts 112*a* disposed beneath the portion 302 of the memory. Multiple conductors of the RDL 108*b* are shown, portions of which are disposed between the processor 102 and memory 104 in order to electrically couple with respective power inputs 128 of the memory 104. Conductive posts 108*a* are shown disposed on each side of the processor 102 for providing power to the memory 104 through the RDL 108*b*. In other embodiments, conductive posts 108*a* can be disposed on two or three sides of processor 102.

Figure 4:
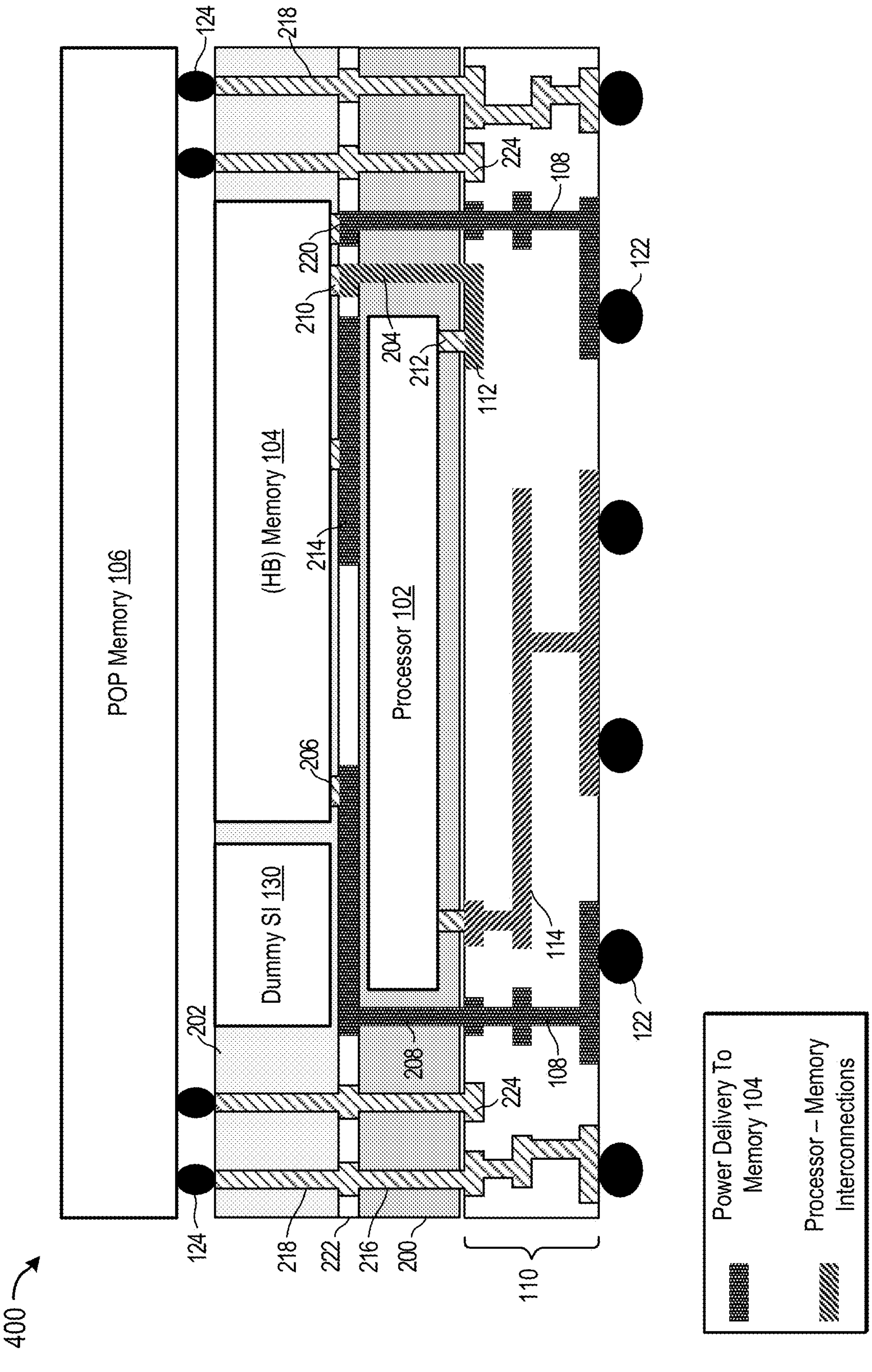
FIG. 4 is a sectional side view illustrating a packaged IC constructed in accordance with another embodiment of the present disclosure.

FIG. 4 is a sectional side view illustrating a packaged IC 400 constructed in accordance with another embodiment of the present disclosure. The packaged IC 400 includes certain elements that are the same or similar to those described previously with reference to FIGS. 1-3, which retain common numbering and may be constructed in a similar fashion as described therewith. The packaged IC 400 of FIG. 4 is similar to the packaged IC 100 of FIG. 1, for example, except that distinct encapsulation layers and additional conductive posts are provided. An example of a fabrication flow for the packaged IC 400 is described in conjunction with FIGS. 5A-5J.

In the illustrated embodiment, the packaged IC 400 includes a fanout layer 110 having power conductors and vias 108 and signal conductors and vias 112/114, a processor 102 having a first surface residing substantially adjacent a first surface of the fanout layer 110, and a plurality of conductive posts 204 and 208 and TMVs or conductive posts 216 extending from the fanout layer 110. The packaged IC 100 further includes a first encapsulant 200 that surrounds a substantial portion of the processor 102 and the plurality of conductive posts 204, 208 and 216, the first encapsulant 200 contacting the fanout layer 110 on a first side and having an exposed second side.

In this example, the packaged IC 400 also includes RDL 222 having a first surface coupled to a second surface of the processor 102 and the exposed second side of the first encapsulant 200. A memory 104 couples to a second surface of the RDL 222 and is configured to communicate with the processor 102 through communication links formed by I/O contacts (e.g., short conductive posts 212) of the processor 102, the fanout layer 110, the plurality of conductive posts 204, the RDL 222, and data connections/conductive contacts 210 of the memory 104. Likewise, a plurality of conductive posts 208 disposed proximate at least one side of the memory 104 are coupled to the fanout layer 110 and conductive features of the of the RDL 222 which are coupled to power inputs/conductive contacts 206 of the memory 104. In an example, the power inputs 206 are arranged in a manner that allows relatively symmetric power delivery to the memory 104.

As shown in FIG. 4, a first portion of the memory 104 is disposed outside a footprint of the processor 102. In this embodiment, the plurality of conductive posts 204 are disposed beneath the first portion of the memory 104 proximate a side of the processor 102. In addition, power may be provided to power input(s) 220 of the first portion of the memory 104 through one or more conductive posts 208 disposed beneath the first portion of the memory 104.

In the illustrated embodiment, a second encapsulant 202 surrounds a portion of the memory 104 and the RDL 222, and a second plurality of TMVs or conductive posts 218 extends from the first plurality of TMVs or conductive posts 216 through the second encapsulant 202 (for providing connections between the fanout layer 110 and a POP memory 106). In an example, connections between the POP memory 106 and the processor 102 are provided by conductive features 224 of the fanout layer 110 (explicit connections between the conductive features 224 and the processor 102 have been omitted in FIG. 4 for sake of clarity). The packaged IC 400 may further include a dummy silicon substrate 130 residing adjacent the memory 104 and at least partially within the second encapsulant 202. The packaged IC 400 may also include ball grid arrays 122 and 124 and the POP memory 106.

Figures 5A, 5B, 5C, 5D, 5E, 5F:
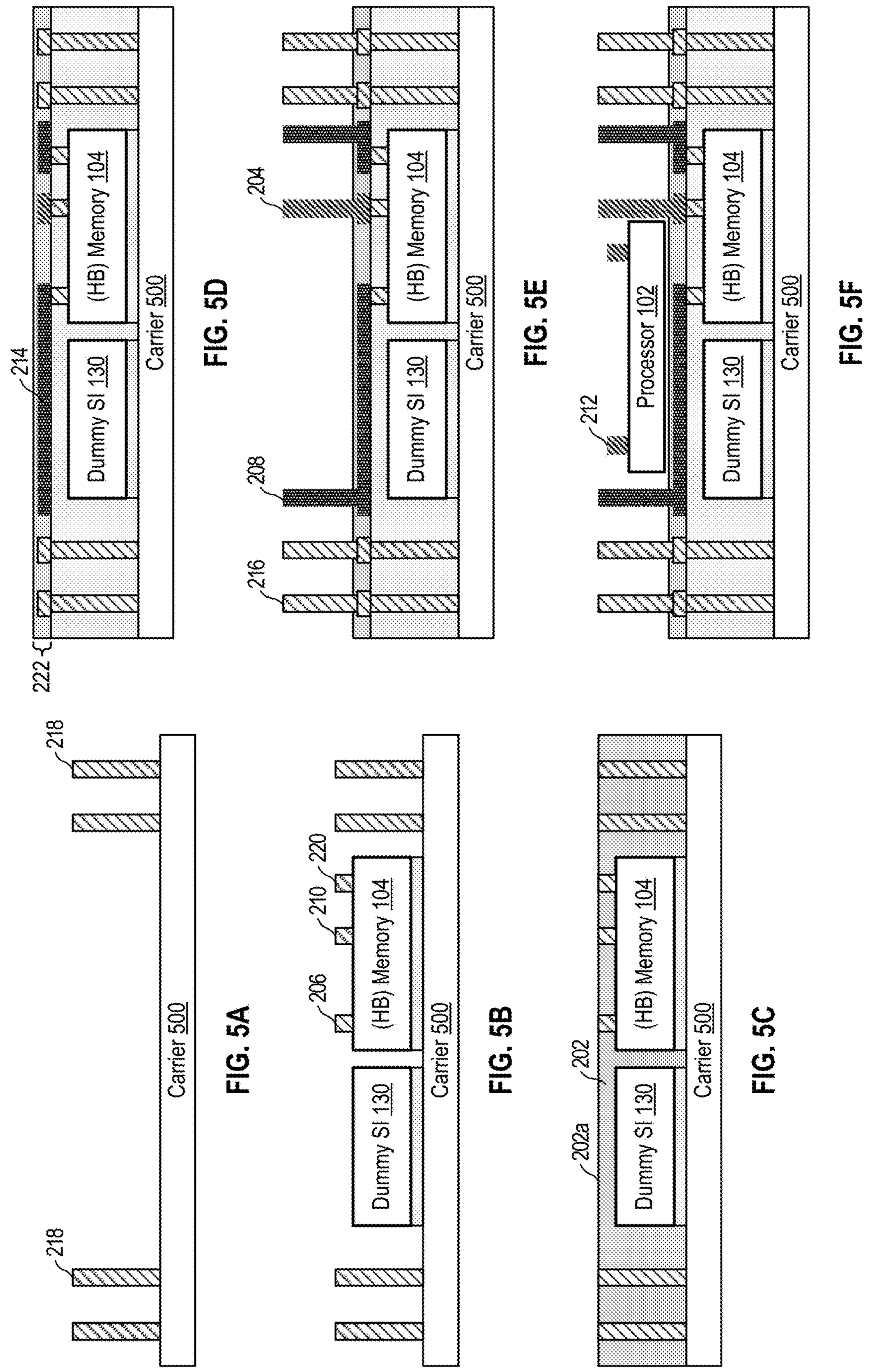
FIGS. 5A-5J are sectional side views illustrating an example of a fabrication flow for a packaged IC constructed in accordance with the embodiment of FIG. 4.

FIGS. 5A-5J are sectional side views illustrating an example of a fabrication flow for a packaged IC constructed in accordance with the embodiment of FIG. 4. Referring to FIG. 5A, the illustrated fabrication flow includes forming first level conductive posts 218 on a carrier substrate 500. The carrier substrate 500 can be formed of silicon, glass, or other suitable material. As shown in FIG. 5B, a first side of a memory 104 (e.g., a high bandwidth memory die) is attached (e.g., via a pick-and-place process and an adhesive, such as a die attach film (DAF), polymer material, or other type of adhesive or glue) to the carrier substrate 500. In this example, a second side of the memory 104 is provided with conductive contacts, such as short copper posts, for power inputs (represented as elements 206 and 220) and data connections (represented as element 210). In an alternate embodiment, the second side of the memory further includes coupling coils or other structures to support wireless communications with a processor. In the embodiment of FIG. 5B, an optional dummy silicon substrate 130 is also attached to the carrier substrate 500 adjacent the memory 104.

The fabrication flow proceeds as shown in FIG. 5C, and a second encapsulant 202 is disposed or molded around and substantially encapsulates the first level conductive posts 218, the memory 104 and the dummy silicon substrate 130. In this example, the second encapsulant 202 contacts the carrier substrate 500 on a first side. The second encapsulant 202 is polished or otherwise formed to have an exposed second side 202*a* that also exposes the first level conductive posts 218 and the conductive contacts 206, 210 and 220.

In the fabrication step illustrated by FIG. 5D, a Redistribution Layer (RDL) 222 is placed or formed on the exposed second side of the second encapsulant 202. A first side of the RDL 222 is disposed proximate to the second side of the memory 104, and the RDL 222 includes conductive features 214 extending beyond and coupled to power inputs of the memory 104. With reference to FIG. 5E, second level conductive posts 204, 208 and 216 (e.g., copper posts) are formed on a second side of the RDL 222. In another example, vias for some or all of the second level conductive posts 204, 208 and 216 are formed prior to construction of the RDL 222.

The fabrication flow continues as shown in FIG. 5F, where a processor 102 (e.g., a processor die or processing unit) is placed on the second side of the RDL such that a first portion of the memory is disposed outside a footprint of the processor and a second portion of the memory is disposed within the footprint of the processor. The processor 102 of the illustrated embodiment includes (short) conductive posts 212 for providing data connections.

Figure 5G:
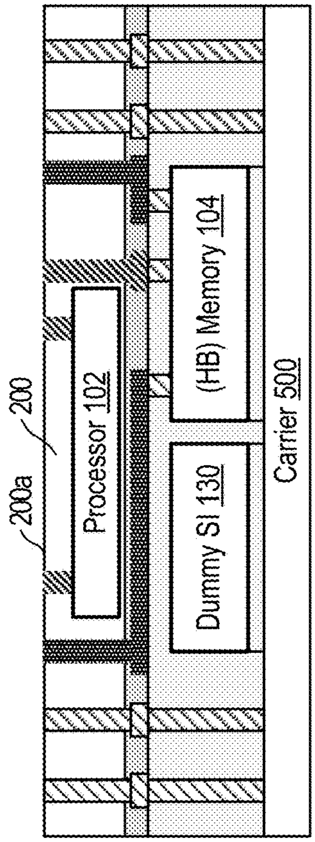

The fabrication flow proceeds as shown in FIG. 5G, and a second encapsulant 202 is disposed or molded around and substantially encapsulates the second level conductive posts 204, 208 and 216 and the processor 102. In this example, a first side of the first encapsulant 200 contacts the second side of the RDL 222. The first encapsulant 200 is polished or otherwise formed to have an exposed second side 200*a* that also exposes the second level conductive posts 204, 208 and 216 and the conductive posts 212.

Figure 5H:
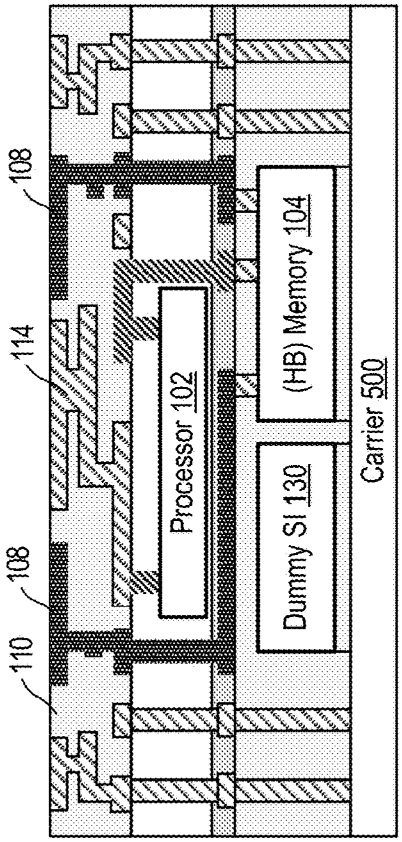
Figure 5I:
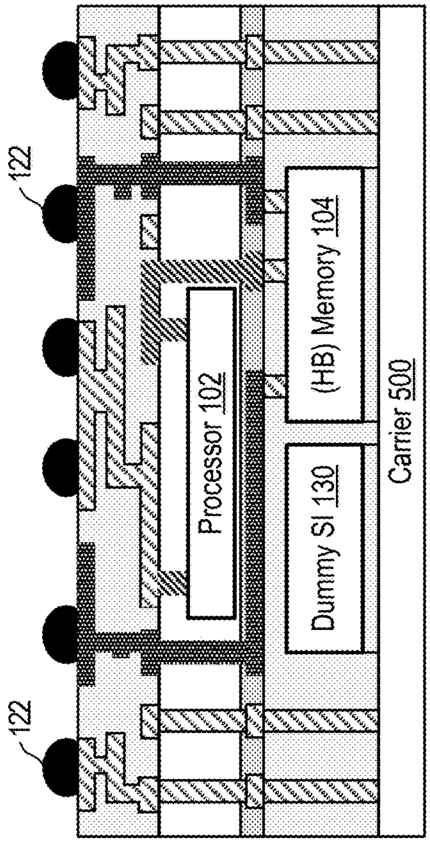
Figure 5J:
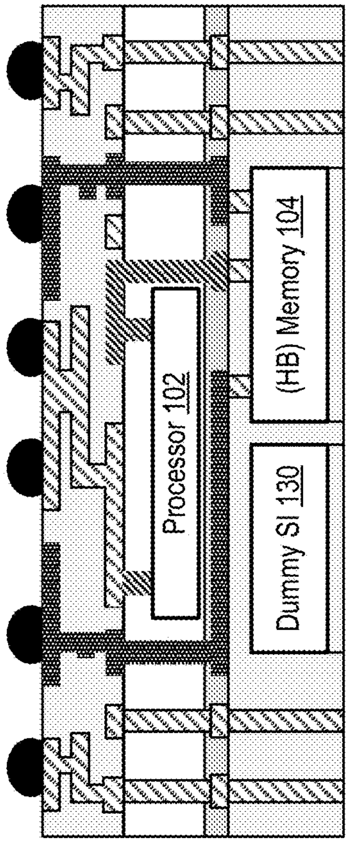

Referring to FIG. 5H, a fanout layer 110 is formed on the exposed second side of the first encapsulant 200, such that a first plurality (204) of the second level conductive posts provide data communication links, via the RDL 222, between the processor 102 and the memory 104, a second plurality (208) of the second level conductive posts are coupled, via the RDL 222, to power inputs of the memory 104, and the first level conductive posts 218 and a third plurality (216) of the second level conductive posts form Through Mold Vias (TMVs) extending between the carrier substrate 500 and the fanout layer 110. As shown in FIG. 5I, a ball grid array 122 is next formed on an exposed surface of the fanout layer 110 to provide electrical connections to the signal conductors and vias of the fanout layer 110. In the example of FIG. 5J, the carrier substrate 500 is removed to expose the first level conductive posts 218. In another example, a ball grid array or other coupling structure (not separately illustrated) can be formed on the exposed first level conductive posts for coupling a Package on Package (POP) memory (not separately illustrated) to the packaged IC. When multiple packaged ICs are manufactured as set forth above on a common substrate/carrier, the fabrication flow may further entail singulation of the packaged ICs.

Figure 6:
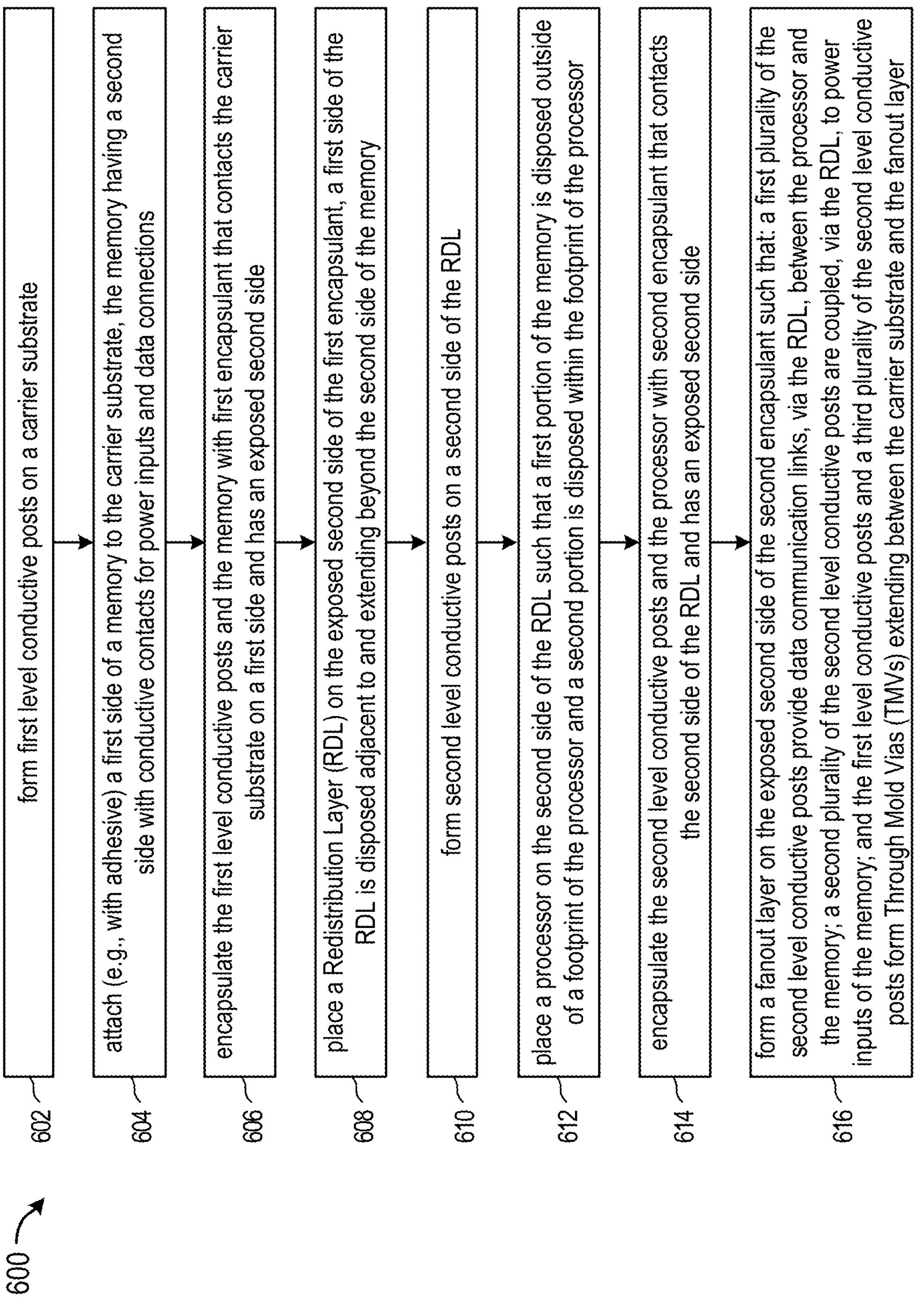
FIG. 6 is a flow chart illustrating operations for constructing a packaged IC in accordance with an embodiment of the present disclosure.

FIG. 6 is a flow chart illustrating operations 600 for constructing a packaged IC according to an embodiment of the present disclosure. Operations 600 include forming first level conductive posts on a carrier substrate (e.g., the carrier substrate 500 of FIG. 5A) at step 602. Operations 600 continue with attaching (e.g., via an adhesive) a first side of a memory to the carrier substrate, the memory having a second side with conductive contacts for power inputs and data connections (step 604). In the illustrated embodiment, the first level conductive posts and the memory are encapsulated with a first encapsulant that contacts the carrier substrate on a first side, the first encapsulant having an exposed second side (step 606).

Operations 600 continue with placing a Redistribution Layer (RDL) on the exposed second side of the first encapsulant, wherein a first side of the RDL is disposed adjacent to and extending beyond the second side of the memory (step 608), and forming second level conductive posts on a second side of the RDL (step 610). Operations 600 further include placing a processor on the second side of the RDL such that a first portion of the memory is disposed outside a footprint of the processor and a second portion of the memory is disposed within the footprint of the processor (step 612). In addition, the second level conductive posts and the processor are encapsulated with second encapsulant that contacts the second side of the RDL and has an exposed second side (step 614). Operations 600 further include forming a fanout layer on the exposed second side of the second encapsulant, such that a first plurality of the second level conductive posts provide data communication links, via the RDL, between the processor and the memory, a second plurality of the second level conductive posts are coupled, via the RDL, to power inputs of the memory, and the first level conductive posts and a third plurality of the second level conductive posts form Through Mold Vias (TMVs) extending between the carrier substrate and the fanout layer (step 616).

Figure 7:
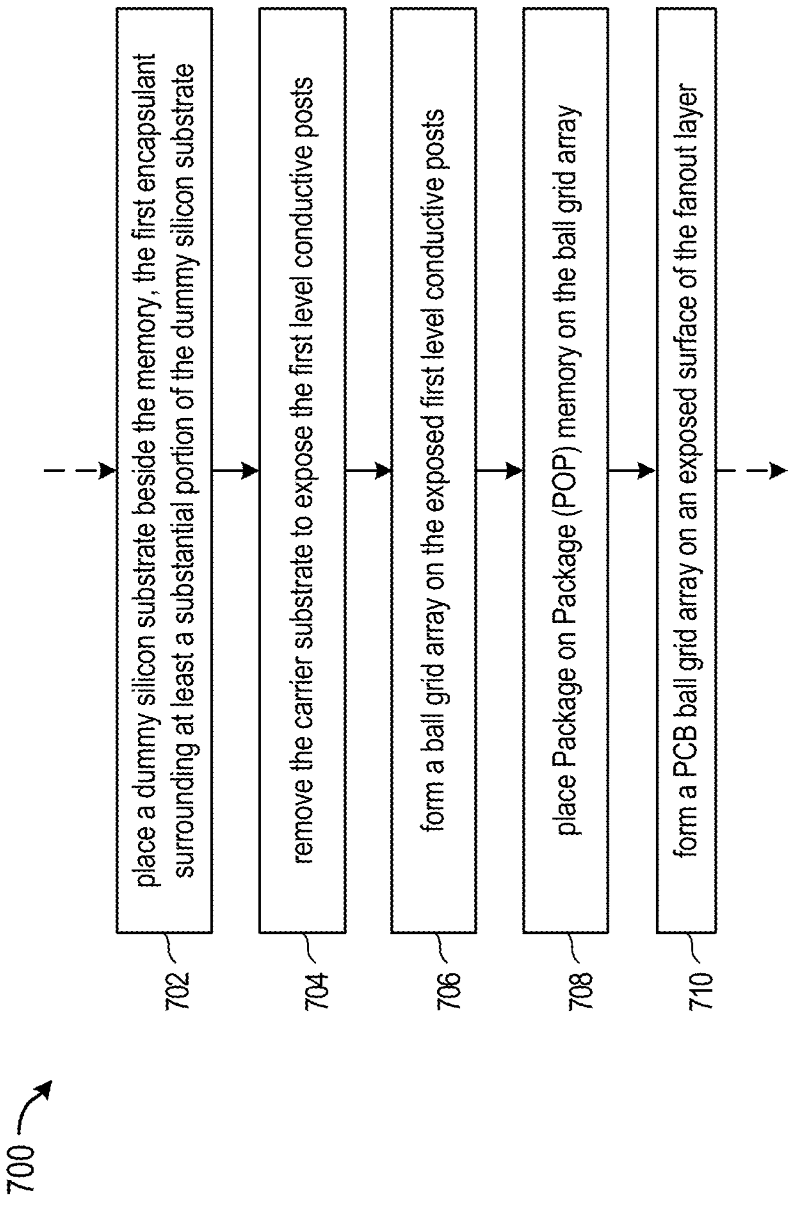
FIG. 7 is a flow chart illustrating optional aspects of the embodiment of FIG. 6 of the present disclosure.

FIG. 7 is a flow chart illustrating optional aspects of the method of the embodiment of FIG. 6 of the present disclosure. The optional aspects 700 of FIG. 7 include placing a dummy silicon substrate beside the memory (e.g., high bandwidth memory), wherein the encapsulant surrounds at least a portion of the dummy silicon substrate (step 702). Other optional aspects 700 include removing the carrier substrate to expose the first level conductive posts (step 704) and forming a ball grid array on the exposed first level conductive posts (step 706). Additional optional aspects 700 include placing Package on Package (POP) memory on the ball grid array (step 708) and forming a PCB ball grid array on an exposed surface of the fanout layer (step 710).

As may be used herein, the terms "processor" and/or "processing unit" or their equivalents (such as identified above) may be a single processing device or a plurality of processing devices. Such a processing device may be a microprocessor, micro-controller, digital signal processor, microcomputer, central processing unit, field programmable gate array, programmable logic device, logic circuitry, analog circuitry, digital circuitry, and/or any device that manipulates signals (analog and/or digital) based on hard coding of the circuitry and/or operational instructions. A processor and/or processing unit may further include memory and/or an integrated memory element, which may be a single memory device, a plurality of memory devices, and/or embedded circuitry of another processor and/or processing unit. Such a memory device may be a read-only memory, random access memory, volatile memory, non-volatile memory, static memory, dynamic memory, flash memory, cache memory, and/or any device that stores digital information. Note that if the processor and/or processing unit includes more than one processing device, the processing devices may be directly coupled together via a wired and/or wireless bus structure.

One or more embodiments of the disclosure have been described above with the aid of method steps illustrating the performance of specified fabrication functions and relationships thereof. The boundaries and sequence of these functional building blocks and method steps have been arbitrarily defined herein for convenience of description. Alternate boundaries and sequences can be defined so long as the specified fabrication functions and relationships are appropriately performed. Any such alternate boundaries or sequences are thus within the scope and spirit of the claims. Further, the boundaries of these functional building blocks have been arbitrarily defined for convenience of description. Alternate boundaries could be defined if the certain significant functions are appropriately performed. Similarly, flow diagram blocks may also have been arbitrarily defined herein to illustrate certain significant fabrication functionality. To the extent used, the flow diagram block boundaries and sequence could have been defined otherwise and still perform the certain significant functionality. Such alternate definitions of both functional building blocks and flow diagram blocks and sequences are thus within the scope and spirit of the present disclosure.

In addition, techniques, systems, subsystems, and methods described and illustrated in the various embodiments as discrete or separate may be combined or integrated with other systems, modules, techniques, or methods without necessarily departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

The one or more embodiments are used herein to illustrate one or more aspects, one or more features, one or more concepts, and/or one or more examples of the disclosure. A physical embodiment of an apparatus, an article of manufacture, a machine, and/or of a process may include one or more of the aspects, features, concepts, examples, etc. described with reference to one or more of the embodiments discussed herein. Further, from Figure to Figure, the embodiments may incorporate the same or similarly named structures, steps, components, etc. that may use the same or different reference numbers and, as such, the structures, steps, components, etc. may be the same or similar structures, steps, components, etc. or different ones.

What is claimed is:

1. A packaged Integrated Circuit (IC) comprising:

a fanout layer including conductive lines and conductive vias;

a processor having a first surface residing substantially adjacent a first surface of the fanout layer;

a Redistribution Layer (RDL) having a first surface coupled to a second surface of the processor;

a memory coupled to a second surface of the RDL, wherein a first portion of the memory is disposed outside of a footprint of the processor and a second portion of the memory is disposed within the footprint of the processor;

an encapsulant surrounding a portion of the memory, the RDL, and the processor, the encapsulant contacting the fanout layer on a first side and having an exposed second side;

a first plurality of conductive posts coupled between the fanout layer and the RDL through a portion of the encapsulant disposed beneath the first portion of the memory proximate a first side of the processor, the first plurality of conductive posts providing data communication links between the processor and the memory via the fanout layer and the RDL;

a second plurality of conductive posts coupled between the fanout layer and conductive features of the RDL through a portion of the encapsulant that is proximate a second side of the processor, the conductive features of the RDL coupled to power inputs of the second portion of the memory;

a third plurality of conductive posts coupled between the fanout layer and the RDL through a portion of the encapsulant that is proximate the first side of the processor, the third plurality of conductive posts coupled, via the RDL, to power inputs of the first portion of the memory; and a plurality of Through Mold Vias (TMVs) extending between the fanout layer and the exposed second side of the encapsulant.

2. The packaged IC of claim 1, wherein the second plurality of conductive posts are further coupled between the fanout layer and conductive features of the RDL through a portion of the encapsulant that is proximate at least a third side of the processor.

3. The packaged IC of claim 1, wherein the processor is one or more of a graphics processing unit, a communications processor, or an application specific processor.

4. The packaged IC of claim 1, further comprising a dummy silicon substrate disposed adjacent the memory.

5. The packaged IC of claim 1, further comprising:

a ball grid array coupled to the plurality of TMVs; and

Package on Package (POP) memory coupled to the ball grid array.

6. The packaged IC of claim 5, wherein the memory is a high bandwidth memory relative to the POP memory.

7. The packaged IC of claim 1, further comprising a PCB ball grid array coupled to a second surface of the fanout layer.

8. A packaged Integrated Circuit (IC) comprising:

a fanout layer including conductive lines and conductive vias;

a processor having a first surface residing substantially adjacent a first surface of the fanout layer;

a plurality of conductive posts extending from the fanout layer;

a first encapsulant surrounding at least a portion of the processor and the plurality of conductive posts, the first encapsulant contacting the fanout layer on a first side and having an exposed second side;

a Redistribution Layer (RDL) having a first surface coupled to a second surface of the processor and the exposed second side of the first encapsulant;

a memory coupled to a second surface of the RDL, wherein a first portion of the memory is disposed outside of a footprint of the processor and a second portion of the memory is disposed within the footprint of the processor;

a first plurality of conductive posts coupled between the fanout layer and the RDL through a portion of the first encapsulant disposed beneath the first portion of the memory proximate a first side of the processor, the first plurality of conductive posts providing data communication links between the processor and the memory;

a second plurality of conductive posts coupled between the fanout layer and conductive features of the RDL through a portion of the first encapsulant that is proximate a second side of the processor, the conductive features of the RDL coupled to power inputs of the second portion of the memory;

a third plurality of conductive posts coupled between the fanout layer and the RDL through a portion of the encapsulant that is proximate the first side of the processor, the third plurality of conductive posts coupled, via the RDL, to power inputs of the first portion of the memory; and a first plurality of Through Mold Vias (TMVs) extending from the fanout layer through the first encapsulant.

9. The packaged IC of claim 8, further comprising a third plurality of conductive posts coupled between the fanout layer and the RDL through a portion of the first encapsulant that is proximate the first side of the processor, the third plurality of conductive posts coupled, via the RDL, to power inputs of the first portion of the memory.

10. The packaged IC of claim 8, wherein the second plurality of conductive posts are further coupled between the fanout layer and conductive features of the RDL through a portion of the first encapsulant that is proximate at least a third side of the processor.

11. The packaged IC of claim 8, further comprising a dummy silicon substrate disposed adjacent the memory.

12. The packaged IC of claim 8, further comprising:

a ball grid array coupled to the second plurality of TMVs; and

Package on Package (POP) memory coupled to the ball grid array.

13. The packaged IC of claim 8, further comprising a second encapsulant surrounding at least a portion of the memory and the RDL; and a second plurality of TMVs extending from the first plurality of TMVs through the second encapsulant.

* * * * *